(12) United States Patent
Mossawir et al.

(10) Patent No.: US 8,823,457 B1
(45) Date of Patent: Sep. 2, 2014

(54) SHORT CIRCUIT CURRENT PROTECTION IN AN AMPLIFIER

(71) Applicant: Google Inc., Mountain View, CA (US)

(72) Inventors: Benjamin Joseph Mossawir, San Carlos, CA (US); Arnd Geis, Mountain View, CA (US)

(73) Assignee: Google Inc., Mountain View, CA (US)

( * ) Notice: Subject to any disclaimer, the term of this patent is extended or adjusted under 35 U.S.C. 154(b) by 49 days.

(21) Appl. No.: 13/717,112

(22) Filed: Dec. 17, 2012

(51) Int. Cl.
*H03F 3/04* (2006.01)

(52) U.S. Cl.
USPC .......................................... 330/298; 330/207 P

(58) Field of Classification Search
USPC ................. 330/298, 207 P, 257, 261, 253
See application file for complete search history.

(56) References Cited

U.S. PATENT DOCUMENTS

| | | | |
|---|---|---|---|
| 5,982,231 A | 11/1999 | Nalbant | |
| 6,108,182 A | 8/2000 | Pullen | |
| 6,300,834 B1 * | 10/2001 | Lin | 330/257 |
| 6,509,797 B2 * | 1/2003 | Nolan | 330/255 |
| 6,586,990 B2 * | 7/2003 | Udo et al. | 330/9 |
| 7,076,070 B2 | 7/2006 | Pearce et al. | |
| 7,276,968 B2 | 10/2007 | Ozawa et al. | |
| 8,085,092 B2 * | 12/2011 | Singnurkar | 330/257 |

* cited by examiner

*Primary Examiner* — Henry Choe
(74) *Attorney, Agent, or Firm* — Morris & Kamlay LLP

(57) ABSTRACT

Systems and methods for protecting circuits from short-circuit events are described. The system may include, for example, first circuitry that receives an output signal from a power amplifier to be protected from a short-circuit event. The first circuitry mirrors an output stage of the power amplifier and provides a mirrored current that mirrors an output stage current of the power amplifier. Second circuitry is operatively coupled to the first circuitry and to the power amplifier. The second circuitry includes, for example, a comparator circuit that compares the mirrored current to a reference current. A first transistor of the comparator circuit is in a mirror configuration with respect to a second transistor of the power amplifier. The second transistor sinks or sources current into the power amplifier to protect the power amplifier from the short-circuit event.

21 Claims, 3 Drawing Sheets

SHORT CIRCUIT CURRENT PROTECTION IN AN AMPLIFIER

CROSS-REFERENCE TO RELATED APPLICATION/INCORPORATION BY REFERENCE

The present application is related to U.S. application Ser. No. 13/717,166, concurrently filed herewith and entitled "Short Circuit Current Protection in an Amplifier." The above-identified application is hereby incorporated by reference herein in its entirety.

BACKGROUND

Conventional circuitry such as an amplifier can fall prey to current damage when the output of the amplifier is placed in a short circuit or other high current condition.

Further limitations and disadvantages of conventional and traditional approaches will become apparent to one of skill in the art through the comparison of such systems with some aspects of some embodiments according to the present disclosure as set forth in the remainder of the present application with reference to the drawings.

BRIEF SUMMARY

Aspects of the disclosure relate to short circuit protection for circuitry. In an example embodiment, the short circuit protection is used to protect an amplifier such as, for example, a power amplifier.

An example embodiment provides one or more circuits that provide short circuit protection. The one or more circuits may include, for example, first circuitry that receives an output signal from a power amplifier to be protected from a short-circuit event. The first circuitry mirrors an output stage of the power amplifier and provides a mirrored current that mirrors an output stage current of the power amplifier. Second circuitry is operatively coupled to the first circuitry and to the power amplifier. The second circuitry includes, for example, a comparator circuit that compares the mirrored current to a reference current. A first transistor of the comparator circuit is in a mirror configuration with respect to a second transistor of the power amplifier. The second transistor sinks or sources current into the power amplifier to protect the power amplifier from the short-circuit event.

An example embodiment provides a method for protecting a power amplifier during a short-circuit event. The method may include, for example, one or more of the following: providing a first transistor that provides an input to the power amplifier when a short-circuit condition occurs on an output of the power amplifier; configuring the first transistor in a first mirror configuration with a second transistor of a comparator circuit; operatively coupling the comparator circuit with first cascoded transistors; and configuring the first cascoded transistors in a second mirror configuration with second cascoded transistors of an output stage of the power amplifier.

An example embodiment provides a system for protecting a power amplifier from a short-circuit condition. The system can include, for example, a first transistor, a second transistor and first cascoded transistors. The first transistor provides an input to the power amplifier when a short-circuit condition occurs on an output of the power amplifier. The second transistor of a comparator circuit is operatively coupled to the first transistor. The first transistor is configured in a first mirror configuration with the second transistor. The first cascoded transistors are operatively coupled to second cascoded transistors and the comparator circuit. The second cascoded transistors are part of an output stage of the power amplifier. The first cascoded transistors are configured in a second mirror configuration with the second cascoded transistors. During the short-circuit condition on the output of the power amplifier, the first transistor provides the input to the power amplifier that overcomes a common-mode feedback response of the power amplifier and reduces a voltage to the output stage of the power amplifier.

These and other advantages, aspects and novel features of the present disclosure, as well as details of an illustrated embodiment thereof, will be more fully understood from the following description and drawings.

DETAILED DESCRIPTION

Aspects of the disclosure relate to short circuit protection for circuitry. In an example embodiment, the short circuit protection is used to protect a circuit such as, for example, one that includes an amplifier.

Figure 1:
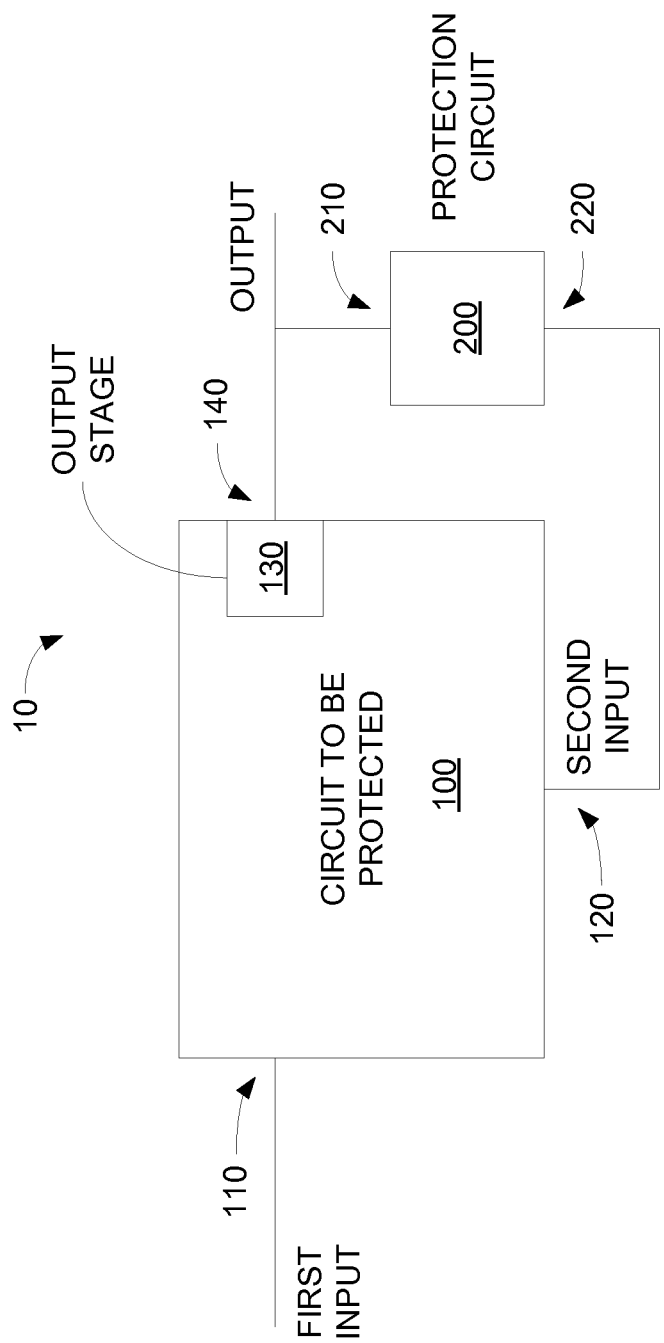
FIG. 1 is a block diagram of an example embodiment of a system for protecting a circuit during a short-circuit condition.

FIG. 1 illustrates a system 10 for protecting a circuit 100 in accordance with an example embodiment of the disclosure. Referring to FIG. 1, the circuit 100 has one or more first inputs 110, one or more second inputs 120, an output stage 130, and one or more outputs 140. A protection circuit 200 is illustrated as having one or more inputs 210 and one or more outputs 220. The input 210 of the protection circuit 200 is coupled to the output of the circuit 100. The output 220 of the protection circuit 200 is coupled to the second input 120 of the circuit 100. Although illustrated as two circuits 100, 200, the circuit 100 and the protection circuit 200 can be part of the same circuit (e.g., integrated circuit, integrated circuit chip, application-specific integrated circuit (ASIC), circuit block, etc.)

In operation, when the circuit 100 is operating normally, the protection circuit 200 does not substantially interfere with the output signal at the output 140 and/or does not consume a lot of power. Input signals are input at the first input 110 and processed (e.g., filtered, modified, amplified, modulated, demodulated, multiplexed, demultiplexed, conditioned, sensed, etc.) by the circuit 100. The circuit 100 then provides output signals based on the input signals on the output 140 of the output stage 130 and/or the circuit 100.

When the circuit 100 is operating in a short-circuit condition such that a large amount of current is passing out of or into the output 140, the protection circuit 200 senses the large amount of current via its input 210 and reduces the amount of current passing into or out of the output 140 by providing a feedback response to the second input 120 of the circuit 100. In an example embodiment, the protection circuit 200 provides a feedback response to the second input 120 of the circuit 100 that controls, at least in part, a voltage and/or a current to the output stage 130 to reduce the amount of current passing into or out of the output 140. In an example embodiment, the protection circuit 200 sends a voltage and/or a current to the second input 120 of the circuit 100 that causes a reduction in the amount of current passing into or out of the output 140. Thus, the circuit 100 is protected from damage that can be caused by sinking or sourcing a large amount of current, for example, during a short-circuit event at the output 140.

Figure 2A:
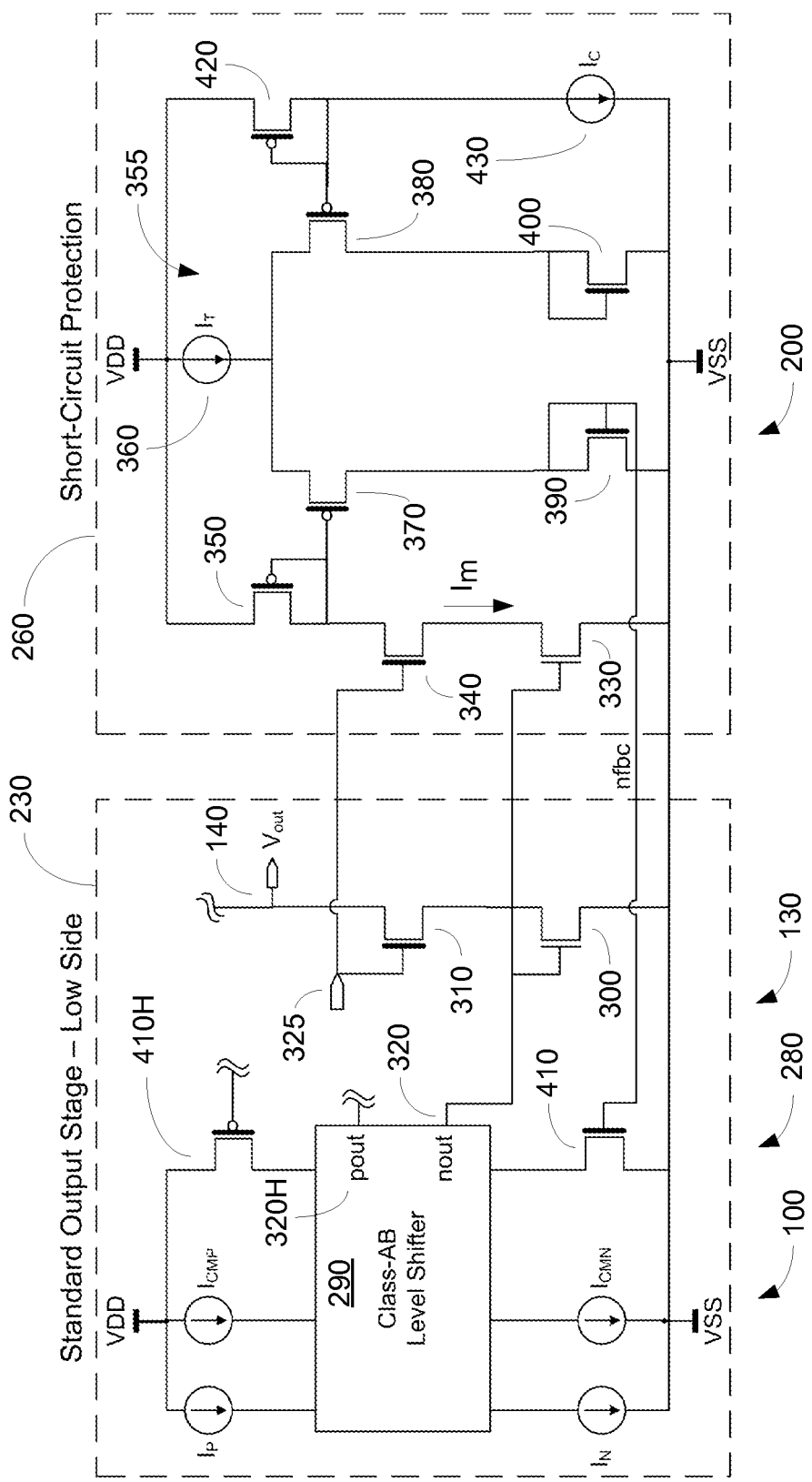
FIG. 2A is a circuit diagram of an example embodiment of a low side of an output stage of the circuit to be protected and a corresponding portion of a protection circuit.
Figure 2B:
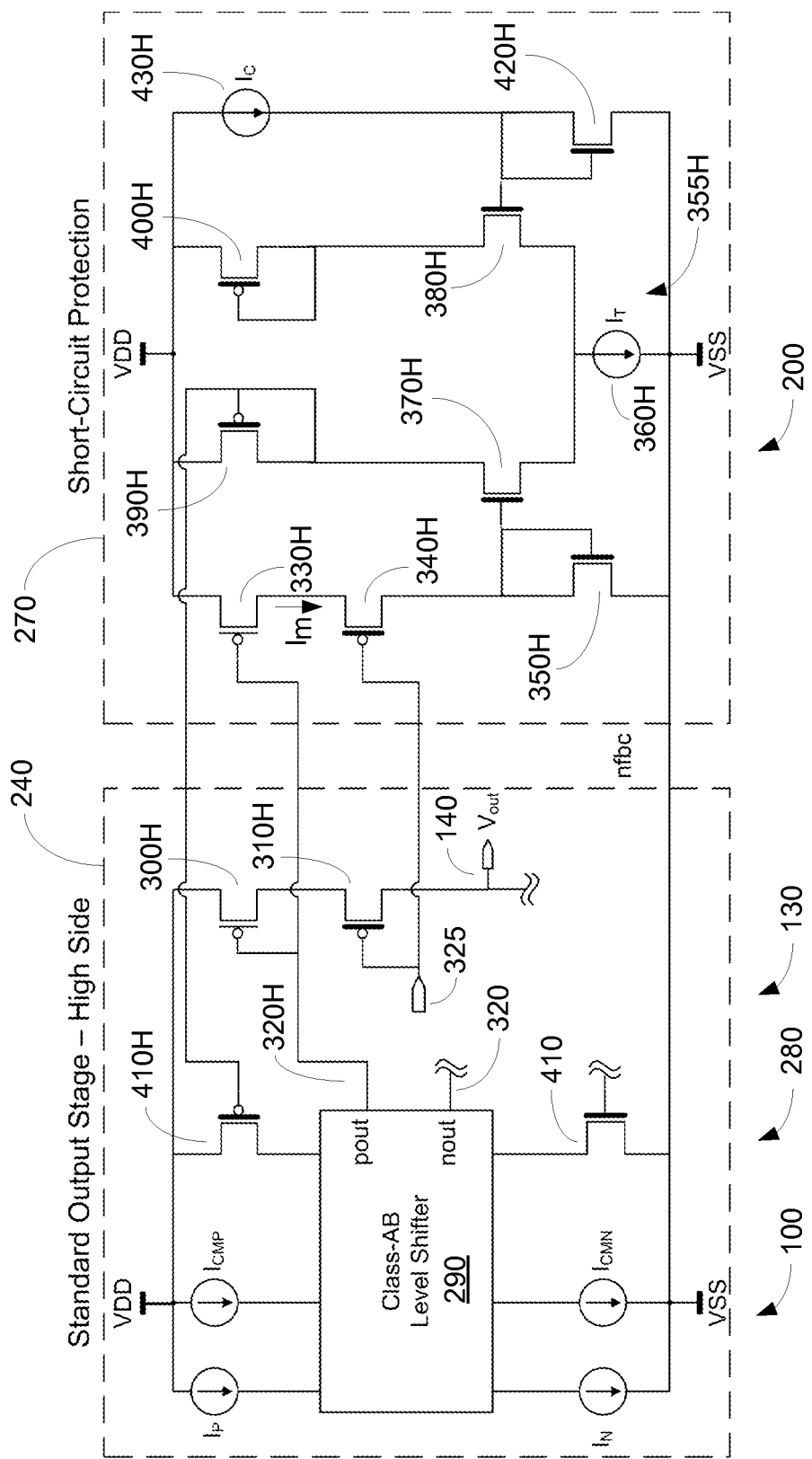
FIG. 2B is a circuit diagram of an example embodiment of a high side of the output stage of the circuit to be protected and a corresponding portion of the protection circuit.

FIGS. 2A and 2B illustrate the circuit 100 and the protection circuit 200 according to an example embodiment of the disclosure. Referring to FIGS. 2A and 2B, a low side 230 and a high side 240 of an output stage 130 of the circuit 100 and corresponding portions (e.g., a high side and a low side) 260, 270 of the protection circuit 200 are shown. Although illustrated as being used with a high side and a low side of an output stage 130, another example embodiment contemplates that the protection circuit 200 is used with circuitry that does not have high side and low side circuitry as illustrated in FIGS. 2A and 2B.

According to the example embodiments illustrated in FIGS. 2A and 2B, the thick gate devices are represented by bold gate terminals; and off-page interrupts in FIG. 2A are signals which connect to high-side circuitry in FIG. 2B and vice versa.

In an example embodiment, the output stage 130 of the circuit 100 is part of an amplifier 280 (e.g., a power amplifier) that includes a level shifter 290 (e.g., a Class AB level shifter) and the output 140 (e.g., output $V_{out}$) of the amplifier 280. In FIGS. 2A and 2B, the level shifter 290 and the $V_{out}$ output 140 are part of both the low side 230 and the high side 240 of the output stage 130.

Referring to FIG. 2A, the low side 230 includes a pair of cascoded transistors 300, 310. The transistors 300, 310 are illustrated as NMOS transistors; however, the transistors 300, 310 (as well as any of the illustrated transistors) can be a different type of transistor such as a different type of MOS transistor, BJT, FET, etc. Transistor 310 is biased by a bias source 325. The $n_{out}$ output 320 of the level shifter 290 is coupled to the cascoded transistor 300, which is then coupled to the $V_{out}$ output 140 through the transistor 310.

The corresponding portion 260 (e.g., the low side) of the protection circuit 200 includes transistors 330, 340 that are also cascoded and mirror cascoded transistors 300, 310 of the output stage 130. The bias source 325 also biases transistor 340. The $n_{out}$ output 320 is also coupled to the cascoded transistor 330. The cascoded transistor 330 and the transistor 340 are coupled to a power supply $V_{DD}$ via a transistor 350. The transistor 350 is illustrated as a PMOS transistor that is configured as a diode. A mirrored current $I_m$ passes through cascoded transistors 340, 330.

The portion 260 of the protection circuit 200 includes a comparator circuit 355 that includes a current source 360 and two transistors 370, 380. The current source 360 provides current $I_T$ and is coupled between the power supply $V_{DD}$ and the transistors 370, 380. The transistors 370, 380 are illustrated as PMOS transistors. Transistors 370, 380 are coupled to a power supply $V_{SS}$ via transistors 390, 400. Transistors 390, 400 are illustrated as NMOS transistors and are configured as diodes. Transistor 390 is further coupled to the level shifter 290 via transistor 410, which is illustrated as an NMOS transistor disposed between the level shifter 290 and the power supply $V_{SS}$. In an example embodiment, the transistor 410 is configured to mirror the current flowing through transistor 390. Transistor 410 and transistor 390 are illustrated as sharing the same gate voltage.

Transistor 380 is coupled to a transistor 420 and a current source 430 (e.g., a reference current source). The current source 430 provides a current $I_C$. The transistor 420 is illustrated as a PMOS transistor and is configured as a diode. Current source 430 provides current $I_C$ and is disposed between the transistor 420 and the power supply $V_{SS}$. The comparator 355 is configured in FIG. 2A as having two voltage inputs with input voltages provided by diodes 350, 420.

In operation, the level shifter 290 outputs a signal through the $n_{out}$ output 320.

If the level shifter 290 is operating in a normal condition in which there is no short circuit condition at the $V_{out}$ output 140 in which a large amount of current is passing into or out of the $V_{out}$ output 140, then the $n_{out}$ signal is amplified and buffered by the cascoded transistors 300, 310 which then outputs the $V_{out}$ output signal on the drain of the transistor 310.

During normal operation, the transistors 330, 340 of the protection circuit 200 mirror the current passing through the cascoded transistors 300, 310 of the low side 230 of the output stage 130 of the circuit 100 or the amplifier 280. An example embodiment provides for scaling (e.g., scaling down) the mirrored current in the protection circuit 200 from the original output current in the output stage 130 of the circuit 100. The mirrored current $I_m$ passes through the transistors 350, 340, 330.

The comparator 355 has two inputs which are illustrated as gates to transistors 370, 380. Transistor 420 is configured as a diode and current $I_C$ passes through the transistor 420 due to current source 430 (e.g., reference current source). The diode 420, which is turned on by the current source 430, provides an input voltage (e.g., a reference voltage) on the gate of transistor 380, which causes transistor 380 to be on. Thus, the current $I_T$ flows through transistor 380 and transistor 400, which is in a diode configuration.

During normal operation, the mirrored current $I_m$ passes through transistors 330, 340 and transistor 350, which is in a diode configuration. Due to the mirrored current $I_m$, the diode 350 develops a voltage that is applied to an input to the comparator 355 and, in particular, to the gate of transistor 370. During normal operation, the developed voltage is not enough to change the balance of the comparator 355. In an example embodiment, the balance of the transistor configuration 370, 380 does not change while current $I_m$ is less than current $I_C$, although other thresholds and offsets can be configured via transistor design. In normal operation, the current $I_T$ continues to flow through transistors 380, 400 instead of transistors 370, 390. Since substantial current does not flow through transistor 390, transistor 390 does not turn on. Thus, transistor 390 does not turn on transistor 410 which, in turn, does not send a current into or out of the level shifter 290 and does not affect the output signal $V_{out}$. In an example embodiment, since substantial current does not flow through transistor 390, a substantial voltage does not develop on the gate of the transistor 390 and the gate of transistor 410. Thus, the transistor 410 does not provide a feedback signal that affects the current or voltage on the $V_{out}$ output 140.

An example embodiment of the disclosure provides that, during normal operation, the protection circuit 200 consumes very little power. Referring to FIG. 2A, the protection circuit 260 consumes power associated with current sources 360, 430. These currents $I_T$, $I_C$ can be designed to be very small currents. Furthermore, the current $I_C$ (e.g., the reference current) can be designed to be a very small current that uses minimal power if current $I_m$ is scaled down, which can be achieved by designing the relative sizes of transistors 330, 340 of the protection circuit 200 with respect to the sizes of transistors 300, 310 in the output stage 130 of the circuit 100.

During short-circuit operation when the $V_{out}$ output 140 is placed in a short-circuit condition, a large amount of current is provided to or from the $V_{out}$ output 140. In an example embodiment, the large amount of current can be near or greater than the amount of current that can cause damage to a circuit (e.g., circuit 100). The large amount of current that passes through transistors 300, 310 is mirrored as a current $I_m$ that passes through transistors 350, 340, 330. In an example embodiment, the protection circuit 100 scales down the large amount of current passing through transistors 300, 310 when mirrored as current $I_m$. In an example embodiment, scaling down the current can be achieved by reducing the relative sizes of the cascoded transistors 330, 340 with respect to cascoded transistors 300, 310.

Since the current $I_m$ mirrors the current passing through transistors 300, 310 in the output stage 130 of the circuit 100, the current $I_m$ is larger during a short-circuit condition than during normal operation. In an example embodiment, the current $I_m$ is greater than the current $I_C$ in a short-circuit condition. The current $I_m$ during a short-circuit condition flows through transistor 350 which develops an input voltage for the comparator 355 and, in particular, a gate voltage for transistor 370. During the short-circuit condition, the gate voltage developed by the diode 350 is large enough to change the balance of the transistor configuration 370, 380. In the short-circuit condition, all or a portion of the current $I_T$ flows through transistors 370, 390. In an example embodiment, the current $I_T$ is steered from one path through transistors 380, 400 to another path through transistors 370, 390.

The current $I_T$ or portion thereof, that passes through transistor 370 causes transistor 390 to turn on and also transistor 410 of the output stage 130 to turn on. In an example embodiment, when transistor 390, which is configured as a diode, is turned on, the resulting voltage developed on its gate is also applied to the gate of the transistor 410.

When the transistor 410 is turned on, the transistor 410 provides a current to the level shifter 290 that overrides the short-circuit response of the level shifter 290, the short-circuit response being to provide a large amount of current at the $V_{out}$ output 140 during a short-circuit condition.

In an example embodiment, when transistor 410 is turned on during a short-circuit condition at the $V_{out}$ output 140, the transistor 410 provides a current that pulls down the voltage of the $n_{out}$ output 320 which, in turn, reduces the current provided to or from the $V_{out}$ output 140. The feedback response provided by transistor 410 and the protection circuit 200 prevents the output stage 130 from sinking or sourcing excessive current on the $V_{out}$ output 140. In an example embodiment, the transistor 410 may be considered part of the protection circuit 200 even if the transistor 410 is integrated with the output stage 130 of the circuit 100.

In an example embodiment, when transistor 410 is turned on during a short-circuit condition at the $V_{out}$ output 140, the transistor 410 provides enough current to cancel the common mode feedback response of the level shifter 290 to the short-circuit condition at the $V_{out}$ output 140. For example, during a short-circuit condition without the protection circuit 200, the level shifter 290 might attempt to correct the output common-mode level by reducing common mode current $I_{CMN}$ (and/or increasing common mode current $I_{CMP}$) so as to raise the gate voltage at an output transistor (e.g., transistor 300), resulting in a large current situation (e.g., an over-current threat situation). An example embodiment provides the protection circuit 200 including the transistor 410 in the output stage 130 of the circuit 100 such that, in a short-circuit condition, the transistor 410 provides enough current to cancel or to overcome the common mode feedback reaction of the level shifter 290. In an example embodiment, the feedback transistor (e.g., transistor 410) provides currents that exceed the largest currents for $I_{CMP}$ or $I_{CMN}$.

In an example embodiment, the transistor 410 is inserted in the circuit 100 such that the transistor 410 mirrors a current steered through the comparator 355 (e.g., comparator configuration 360, 370, 380) in a corresponding protection circuit 200. The transistor 410 provides protection feedback to the circuit 100 that is strong enough to dominate the common mode feedback of the circuit 100 and/or the amplifier 280 that has an output that is shorted to one of the power supplies $V_{DD}$, $V_{SS}$ or is otherwise in a short-circuit condition. In an example embodiment, the protection feedback provided by the transistor 410 to the circuit 100 ensures that the gate voltage of the transistor 300 is kept within a safe operating range at all times.

In an example embodiment, transistor 410 mirrors the current that flows through transistor 390. The mirrored current in transistor 410 can be scaled (e.g., scaled up) so that the transistor 410 can provide sufficient current to cancel or to overcome the common mode feedback response of the level shifter 290. In an example embodiment, the transistor 410 can be configured in a particular mirror ratio such that the currents mirrored by the transistor 410 exceed the largest currents for currents $I_{CMP}$ or $I_{CMN}$. A particular mirror ratio can be achieved, for example, by controlling the relative sizes of the transistors 390, 410. In addition, the size of current $I_T$ can also be used to determine how much current is mirrored at the transistor 410.

FIG. 2B illustrates a high side 240 of the output stage 130 of the circuit 100 and a corresponding portion 270 (e.g., high side) of the protection circuit 200. Components of the high side 240 of the output stage 130 and the corresponding portion 270 of the protection circuit 200 illustrated in FIG. 2B use the same reference numbers with similar components in the low side circuits 230, 260, but with an "H" added. Thus, for example, feedback NMOS transistor 410 in the low side 230 functions in a similar fashion as feedback PMOS transistor 410H in the high side 240. Some of the differences are in the voltage and current polarities. Furthermore, although the $n_{out}$ output 320 of the level shifter 290 provides an output signal to cascoded NMOS transistors 300, 310 in the low side 230, the $p_{out}$ output 320H of the level shifter 290 provides an output signal to cascoded PMOS transistors 300H, 310H in the high side 240. Both sets of cascoded transistors 300, 310, 300H, 310H provide an output signal on the $V_{out}$ output 140. The protection circuit 200 on the high side 270 has similar components as the protection circuit 200 on the low side 260 as understood in viewing the circuit diagrams as set forth in FIGS. 2A and 2B.

The operation of the high side 240 of the output stage 130 of the circuit 100 and the corresponding portion 270 of the protection circuit 200 as illustrated in FIG. 2B is analogous to the operation description associated with the low side 230 of the output stage 130 of the circuit 100 and the corresponding portion 260 of the protection circuit 200 as illustrated in FIG. 2A with the appropriate replacement of reference numbers and voltage/current polarities.

In sum, an example embodiment provides an output stage of a circuit and/or amplifier that is to be protected from short circuit events by a protection circuit. The protection circuit mirrors the output current of the output stage and compares the mirrored current to its own reference current using a comparator. When the mirrored current is sufficiently large, it is an indication of a short-circuit event. The protection circuit provides a feedback response in response to the short-circuit event through a mirrored transistor to the output stage to overcome the short-circuit response of the output stage. In an example embodiment, the protection circuit provides a current to the output stage to overcome a common mode feedback response of the output stage in which the common mode feedback response is, but for the protection circuit, to increase the current passing into or out of the output stage.

An example embodiment provides a protection circuit that can be deployed in a variety of high power delivery circuits that interface with transducers, including one or more of the following: radio frequency power amplifiers, high-speed buffers, light emitting diode (LED) drivers, and audio power amplifiers.

An example embodiment provides that the circuit to be protected is part of a line driver (e.g., an integrated asymmetric digital subscriber line driver). The protection circuit can be employed with upstream and/or downstream line drivers. In an example embodiment, the line driver is configured to transmit high-power 25 kHz-2.2 MHz discrete multi-tone signals into a transformer-coupled 100Ω line. Line drivers can deliver high current into low impedance loads at signal peaks. An example embodiment provides that the protection circuit 200 to prevent damage to the line driver during short-circuit events (e.g., on the chip or line side of the transformer) such as during assembly and/or field operation. The protection circuit can be configured to prevent electro-migration failures and thermal runaway, while not interfering with mission-mode operation of the line driver.

An example embodiment provides that the protection circuit provides on-chip protection circuitry.

An example embodiment provides that the protection circuit provides short-circuit protection to circuits that deliver high power to low impedances.

An example embodiment provides for protecting a line driver (e.g., a CMOS Class AB line driver) against over-current damage when the output (e.g., a $V_{out}$ output) is shorted to one of the power supplies $V_{DD}$, $V_{SS}$.

An example embodiment provides for aggressive scaling between the cascoded transistors of the output stage of the circuit and the cascoded transistors of the protection circuit to reduce operating power, especially when the circuit to be protected is operating normally and is not in a short-circuit condition.

An example embodiment provides for using replica current to sense a plant output current, rather than a voltage proxy that might depend on the relative size or polarity of transmitted and terminal signals.

An example embodiment provides for using a current mirror instead of a switch, eliminating a high impedance node from the protection feedback loop. Furthermore, the current mirror configuration is easier to stabilize.

An example embodiment provides for developing input voltages to the comparator configurations in the protection circuit using diodes instead of resistors to ensure reliability of comparator input oxides when the protection circuit operates off a different power supply from the circuit to be protected. In addition, diodes can provide soft clamping that precludes abrupt transitions near the extremes of the normal operating regime, and can eliminate the need for the reference current to be a 1/R reference current.

An example embodiment provides for the elimination of cascoded transistors when using thin-gate transistors. The use of thin-gate transistors substantially throughout the protection circuit may be employed, for example, in low-supply applications.

An example embodiment provides that, with single-ended or pseudo-differential loads, the output node may become sufficiently low impedance that the comparator can be an operational transconductance amplifier (OTA), with high output impedance, and the feedback transistor inserted in the circuit to be protected can operate as a switch.

An example embodiment provides that resistors, instead of diodes, provide the input voltages to the comparator in the protection circuit. Resistors might be appropriate in certain low-supply operations where a 1/R reference current is available.

While the present method and apparatus has been described with reference to certain embodiments, it will be understood by those skilled in the art that various changes may be made and equivalents may be substituted without departing from the scope of the present method and apparatus. In addition, many modifications may be made to adapt a particular situation or material to the teachings of the present disclosure without departing from its scope. Therefore, it is intended that the present method and apparatus not be limited to the particular embodiment disclosed, but that the present method and apparatus will include all embodiments falling within the scope of the appended claims.

What is claimed is:

1. One or more circuits that provide short circuit protection, comprising:
    first circuitry that receives an output signal from a power amplifier to be protected from a short-circuit event, the first circuitry mirroring an output stage of the power amplifier and providing a mirrored current that mirrors an output stage current of the power amplifier; and
    second circuitry operatively coupled to the first circuitry and to the power amplifier, the second circuitry including a comparator circuit that compares the mirrored current to a reference current,
    wherein a first transistor of the comparator circuit is in a mirror configuration with respect to a second transistor of the power amplifier, and
    wherein the second transistor sinks or sources current into the power amplifier to protect the power amplifier from the short-circuit event.

2. The one or more circuits according to claim 1, wherein the second circuitry is operatively coupled to a level shifter of the power amplifier, and wherein the second transistor sinks or sources current into the level shifter of the power amplifier to protect the power amplifier from the short-circuit event.

3. The one or more circuits according to claim 1, wherein the second transistor sinks or sources current into a level shifter of the power amplifier to overcome a common-mode feedback response of the power amplifier during the short-circuit event.

4. The one or more circuits according to claim 1, wherein the first circuitry includes cascoded transistors.

5. The one or more circuits according to claim 1, wherein the first circuitry includes first cascoded transistors that mirror second cascoded transistors of the power amplifier.

6. The one or more circuits according to claim 1, wherein the comparator circuit comprises a third transistor, a fourth transistor and a current source.

7. The one or more circuits according to claim 6, wherein a first input of the comparator circuit is an input of the third transistor, and wherein the second input of the comparator circuit is an input of the fourth transistor.

8. The one or more circuits according to claim 7, wherein the input of the third transistor is a voltage developed by a first diode, and wherein the input of the fourth transistor is a voltage developed by a second diode.

9. The one or more circuits according to claim 8, wherein the mirrored current that mirrors the output stage current of the power amplifier passes through the first diode and cascoded transistors.

10. The one or more circuits according to claim 8, wherein the reference current passes through the second diode to develop the voltage on the input of the fourth transistor.

11. The one or more circuits according to claim 1, wherein the comparator circuit has a first input and a second input, wherein the first input is a voltage developed by a first diode through which the mirrored current passes, and wherein the second input is a voltage developed by a second diode through which the reference current passes.

12. The one or more circuits according to claim 6, wherein the comparator circuit steers current from the current source through the fourth transistor instead of the third transistor when the power amplifier is not in a short-circuit event.

13. The one or more circuits according to claim 6, wherein the comparator circuit steers current through the third transistor instead of the fourth transistor during the short-circuit event.

14. The one or more circuits according to claim 1, wherein, when the second transistor sinks or sources current into a level shifter of the power amplifier, the level shifter causing a voltage to drop or rise on an output of the power amplifier that provides the output signal.

15. The one or more circuits according to claim 1, wherein, when the power amplifier is not in the short-circuit event, the first circuitry, the second circuitry and the second transistor do not interfere with the output signal of the power amplifier.

16. A method for protecting a power amplifier during a short-circuit event, comprising:
   providing a first transistor that provides an input to the power amplifier when a short-circuit condition occurs on an output of the power amplifier;
   configuring the first transistor in a first mirror configuration with a second transistor of a comparator circuit;
   operatively coupling the comparator circuit with first cascoded transistors; and
   configuring the first cascoded transistors in a second mirror configuration with second cascoded transistors of an output stage of the power amplifier.

17. The method according to claim 16, wherein the input provided by the first transistor is a current that causes the power amplifier to reduce or increase the voltage to the output stage of the power amplifier during the short-circuit condition, and wherein the current provided by the first transistor to the power amplifier overcomes a common-mode feedback response of the power amplifier.

18. The method according to claim 16, wherein the short-circuit condition occurs when the output of the amplifier is undesirably coupled to a power supply.

19. The method according to claim 16, wherein the first transistor, the comparator circuit, and the first cascoded transistors do not interfere with the output of the power amplifier unless the power amplifier is in the short-circuit event.

20. A system for protecting a power amplifier from a short-circuit condition, comprising:
   a first transistor that provides an input to the power amplifier when a short-circuit condition occurs on an output of the power amplifier;
   a second transistor of a comparator circuit operatively coupled to the first transistor, wherein the first transistor is configured in a first mirror configuration with the second transistor; and
   first cascoded transistors operatively coupled to second cascoded transistors and the comparator circuit, wherein the second cascoded transistors are part of an output stage of the power amplifier, and wherein the first cascoded transistors are configured in a second mirror configuration with the second cascoded transistors,
   wherein, during the short-circuit condition on the output of the power amplifier, the first transistor provides the input to the power amplifier that overcomes a common-mode feedback response of the power amplifier and reduces a voltage to the output stage of the power amplifier.

21. The system according to claim 20, wherein the first transistor, the comparator circuit, and the first cascoded transistors do not interfere with the output of the power amplifier unless the power amplifier is in the short-circuit condition.

* * * * *